United States Patent [19]

Kirk

[11] Patent Number: 4,629,971
[45] Date of Patent: Dec. 16, 1986

[54] SWITCH MODE CONVERTER AND IMPROVED PRIMARY SWITCH DRIVE THEREFOR

[75] Inventor: Glenn D. Kirk, El Toro, Calif.

[73] Assignee: Mai Basic Four, Inc., New York, N.Y.

[21] Appl. No.: 722,071

[22] Filed: Apr. 11, 1985

[51] Int. Cl.[4] .............................................. H03K 17/00
[52] U.S. Cl. .................................... 323/289; 363/16; 307/270
[58] Field of Search ....................................... 363/16-17, 363/98, 131-134; 323/289; 307/253-254, 270, 280, 300

[56] References Cited

U.S. PATENT DOCUMENTS

| | | |
|---|---|---|
| 3,838,329 | 9/1974 | Michelet et al. . |
| 3,983,418 | 9/1976 | Wallace .................. 323/289 X |
| 4,016,482 | 4/1977 | Cielo et al. . |
| 4,034,282 | 7/1977 | Renard . |
| 4,177,393 | 12/1979 | Förster .................. 307/300 X |
| 4,218,647 | 4/1980 | Hass . |
| 4,302,807 | 11/1981 | Mentler . |
| 4,312,029 | 1/1982 | Zellmer . |
| 4,322,785 | 3/1982 | Walker . |
| 4,353,112 | 10/1982 | Rietveld et al. .............. 363/16 |

Primary Examiner—Peter S. Wong
Attorney, Agent, or Firm—Amster, Rothstein & Ebenstein

[57] ABSTRACT

A switch mode converter is disclosed which has an improved base drive therefor. The switch mode converter includes a pair of primary transistor switches each of which is connected to a transformer having a feedback winding connected to the respective transistor in a proportional base drive configuration. A controller circuit controls a switch connected in series with the primary winding of each transformer to switch the current supplied to the primary winding of each transformer from first and second current supplying circuits. Each second current supplying circuit temporarily supplies current to the transformer during the time that the respective transistor is being switched off to shorten the turn-off time of the transistor. The second current supplying circuits are coupled to the output of the primary switches and each is supplied with energy only when the respective transistor is switched on, and therefore do not saturate the transformer or continuously dissipate power.

21 Claims, 7 Drawing Figures

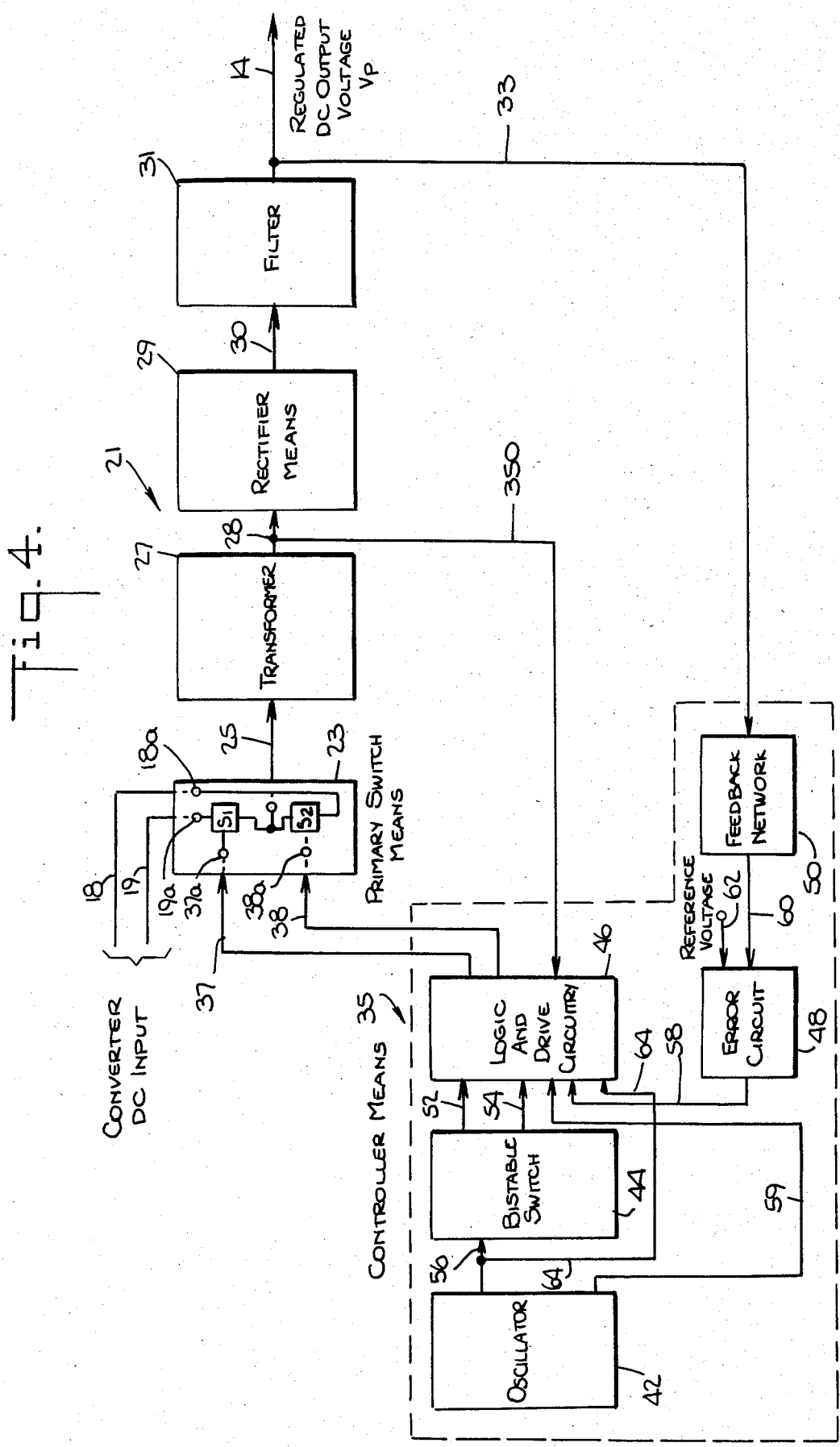

SWITCH MODE CONVERTER AND IMPROVED PRIMARY SWITCH DRIVE THEREFOR

BACKGROUND OF THE INVENTION

The present invention relates to switching circuits in general, and in particular to a switch mode converter and a primary switch drive therefor.

The term "switch mode converter" is used herein in a broad sense, and encompasses DC to DC, AC to DC, AC to AC and DC to DC switch mode converters. The term "switch" is also used herein in a broad sense and can encompass two or more individual switch elements.

DC to DC switch mode converters convert a DC input voltage to a regulated DC output voltage by chopping the DC input voltage with a primary switch means to convert it to an AC voltage and then rectify and filter the AC voltage to provide the DC output voltage. A transformer or some other means may be provided to change the level of the chopped AC voltage so that the DC output voltage is obtained at the desired level after rectification and filtering. The DC output voltage is regulated by applying control signals to the primary switch means, which includes one or more primary switches, to vary its duty cycle and hence the duty cycle of the AC voltage obtained from chopping.

It is highly desireable that the primary switches be turned on and off in as short a time as possible and as efficiently as possible to protect the primary switches, improve converter performance and reduce the power dissipation of the converter.

Many switch mode converters utilize transistors as the primary switches. Due to storage time characteristics, transistors exhibit a delay between receiving a signal to turn the transistor off and actually turning off. This delay which is dependent on the particular transistor and the current it is conducting, can impair converter performance and efficiency as well as subject the transistor and other parts of the converter to damage.

In a known transistor switching circuit, a transistor is coupled as a primary switch and switched on and off by a controller means including a transformer having a primary winding and a secondary winding, switch means for opening and closing a current path through the transformer primary winding and a current supplying means coupled to the transformer primary winding. The current supplying means comprises a resistor coupled between a voltage source and the primary winding, and a capacitor coupled between ground and the connection of the resistor to the primary winding so as to charge through the resistor and discharge through the primary winding. The transformer secondary includes a main portion coupled across the base/emitter of the transistor to turn it on and off in response to current flow in the primary winding and a feedback portion coupled to the emitter of the transistor to induce current in the main secondary winding portion after the transistor has been turned on to maintain it turned on.

When the switch means closes the current path, current builds up in the primary winding as produced by the voltage across the capacitor and the inductance of the primary winding and causes energy to be stored in the core of the transformer. When the switch means opens the current path, the energy stored in the core of transformer induces current in the main secondary winding portion which flows into the base of transistor to turn it on. The feedback winding portion then provides positive feedback to the main winding portion to maintain the transistor on with a base current essentially proportional to its collector current. During the time that the switch means opens the current path through the transformer primary winding, the capacitor is recharged from the voltage source. When the switch means again closes the current path, the voltage across the charged capacitor generates a reverse polarity voltage across the primary winding which induces a reverse voltage across the base/emitter of the transistor and a negative drive current to the base of the transistor. In order to prevent saturation of the transformer, the current supplying means is made self-adjusting by operation of the circuit and the voltage across the capacitor supplies volt-seconds to the transformer sufficient to cause switching of the transistor and insufficient to saturate the transformer. The volt-seconds provided to the transformer primary winding are the result of a compromise between obtaining fast transistor switching and preventing transformer saturation. Therefore, the negative base current provided to the transistor induced by the charge on the capacitor builds up relatively slowly due to this compromise and can delay turn-off of the transistor. Simply continuously increasing the volt-seconds supplied to the transformer primary winding in order to induce more turn-off current out of the base of the transistor could result in transformer saturation, and simply increasing the size of the capacitor and/or the voltage source does not provide faster turn-off of the transistor at the switching speeds typically used in switch mode converters. Also, increasing the size of the capacitor or making other changes in the transformer primary circuit could affect the transformer secondary output signals so that overall performance can be degraded quite easily.

There is thus a need to switch semi-conductor switches on and off efficiently and more rapidly while permitting switching at high speeds and without detracting from other performance characteristics of the switching circuit.

OBJECTS AND SUMMARY OF THE INVENTION

It is an object of the present invention to improve the performance of switches, particularly semi-conductor switches.

It is also an object of the present invention to reduce the switching time of switches, particularly semi-conductor switches switching relatively large currents and/or voltages.

It is another object of the present invention to reduce the switching time of primary switches, particularly semi-conductor switches, in switch mode converters without adversely affecting other performance characteristics of the converters.

It is another object of the present invention to improve efficiency in switching the primary switches of switch mode converters, particularly semi-conductor primary switches.

It is another object of the present invention to reduce switching time caused by storage time delays in semi-conductor switches.

It is another object of the present invention to provide improved drive circuitry for semi-conductor switches.

It is another object of the present invention to provide an improved switch mode converter which realizes any of the foregoing objects.

The above and other objects are achieved by the invention disclosed herein, which provides a plurality of current supplying means which cooperate during switching of a switch, e.g. a primary switch in a switch mode converter, to reduce its switching time. At least one of the current supplying means only temporarily provides a current for switching the switch. According to one embodiment, this at least one current supplying means includes an energy storage element coupled to receive energy from the output of the switch during only a first switching state of the switch, and which causes the current supplying means to supply current to complete switching of the switch out of its first state for only a short time after the switch has started to switch out of the first state.

According to a specific embodiment of the invention, a switching circuit comprises a first switch, e.g. a primary switch in a switch mode converter, and controller means for switching the first switch on and off. The first switch has a first input, a second input, and an output, and switches between on and off states coupling and decoupling its first input and its output in response to signals supplied to its second input. The controller means comprises a transformer and first and second current supplying means. The transformer has a primary winding and a secondary winding with the secondary winding being coupled to the second input of the first switch and supplying the signals thereto for switching the first switch. The first current supplying means is coupled to the primary winding of the transformer and supplies current thereto, and the second current supplying means is coupled to the primary winding of the transformer and also supplies current thereto. The controller means also includes switch means for selectively permitting and preventing current flow through the transformer primary winding. In operation, the transformer and the first and second current supplying means cooperate to switch the first switch from a first state to a second state when the switch means permits current flow through the transformer primary winding and to maintain the first switch in the second state while the switch means permits current flow through the transformer primary winding, and further, to switch the first switch back to the first state when the switch means prevents current flow through the transformer primary winding and to maintain the first switch in the first state while current flow through the transformer primary winding is prevented. The second current supplying means supplies current to the transformer primary winding during only an initial portion of the time in which current flow is permitted in the transformer primary winding effective to cause the transformer to switch the first switch from the first state to the second state, and the first current supplying means supplies current at least after the initial portion of the time in which current flow is permitted effective to cause the transformer to maintain the first switch in the second state and to enable the transformer to switch the first switch back to the first state when current flow is next permitted. As a result, the second current supplying means supplies current temporarily when it is needed, and thereby avoids impressing excessive volt-seconds across the transformer primary winding which could otherwise saturate the transformer core and prevent proper switching operation. In addition, the second current supplying means draws energy temporarily without continuously dissipating energy.

In a preferred embodiment, the first input of the first switch is coupled to an input voltage to be switched by the first switch and the second circuit supplying means is coupled to the first switch output so that the second current supplying means receives energy essentially only when the first switch is in an on state. The first current supplying means comprises a first resistor coupled to a source of energy and coupled to the transformer primary winding, and a first capacitor coupled to the first resistor and to the transformer primary winding so as to be charged through the first resistor and discharged through the transformer primary winding; the second current supplying means comprises a second resistor coupled to the first switch output and to the transformer primary winding, and a second capacitor coupled to the second resistor and to the transformer primary winding so as to be charged through the second resistor and discharged through the transformer primary winding; and the controller means includes means for blocking the flow of current between the first and second current supplying means. The current blocking means comprises a diode coupled in series in the second current supplying means and another diode coupled between the first and second current supplying means to block current flow between the two current supplying means. The switch means comprises a second switch connected in series with the transformer primary winding, and a controller circuit which switches the second switch.

In the illustrated embodiments, the first switch comprises a transistor having its base coupled to the transformer primary winding, its collector coupled to an input voltage to be switched by the first switch, and its emitter coupled to the first switch output; the transformer secondary winding comprises two winding portions, a main portion being coupled to the base of the transistor and a feedback portion being coupled to the emitter of the transistor, the transformer being configured so that the feedback portion induces current in the main portion after the transistor has been turned on to thereby maintain the transistor turned on.

The switching circuit has particular utility in a switch mode converter, particularly a DC to DC converter having rectification and filtering circuits to provide a regulated DC output voltage from a raw DC voltage input. A preferred embodiment of a switch mode converter utilizes a pair of switching circuits having a common controller circuit for alternately switching the transistor switches on and off.

The above and other objects, aspects, features and advantages of the present invention will be more readily preceived from the following description of the preferred embodiments thereof taken with the accompanying drawings and appended claims.

BRIEF DESCRIPTION OF THE DRAWINGS

The present invention is illustrated by way of example and not limitation in the figures of the accompanying drawings in which like numbers indicate similar parts and in which:

FIG. 4 is a more detailed block diagram of the DC to DC switch mode converter depicted in FIG. 3;

DESCRIPTION OF THE PREFERRED EMBODIMENTS

Figure 2:
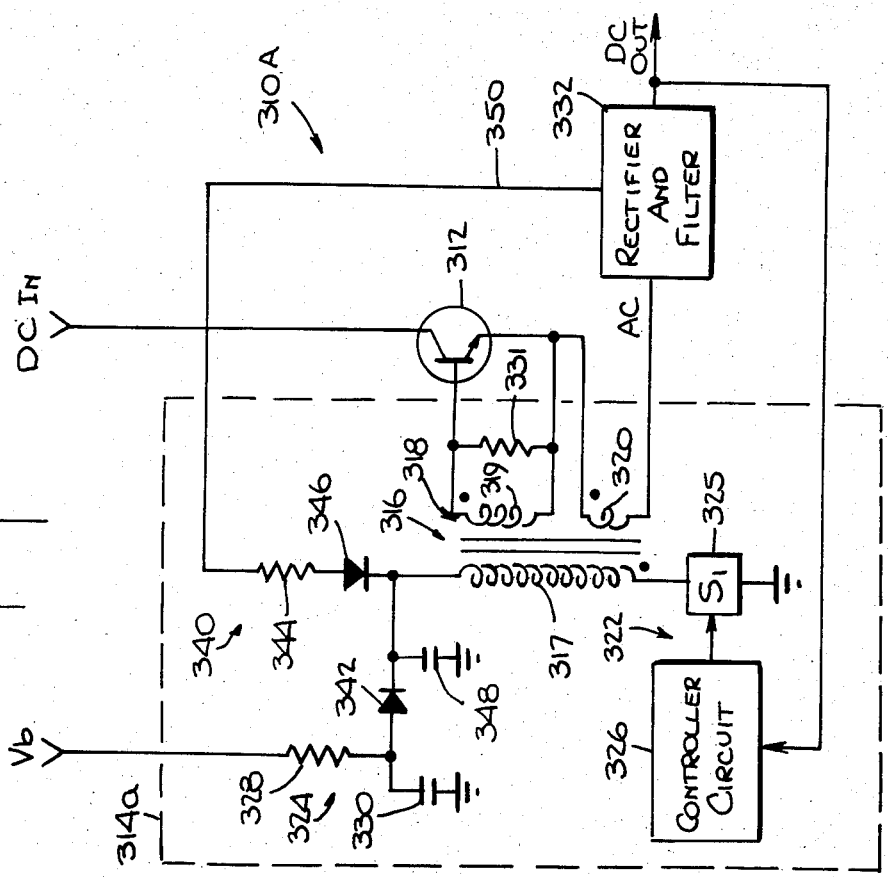
FIG. 2 is a schematic diagram of a switching circuit according to the present invention.
Figure 1:
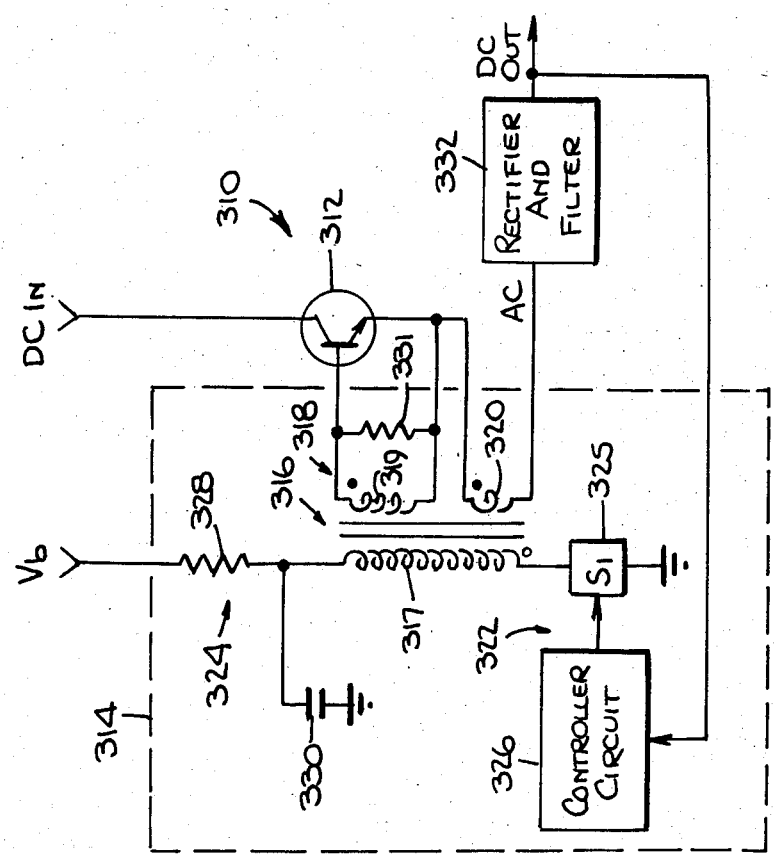
FIG. 1 is a schematic diagram of a prior art switching circuit.

Switching Circuit (FIGS. 1-2)

In a known transistor switching circuit 310 depicted in FIG. 1, a transistor 312 is coupled as a primary switch and switched on and off by a controller means 314 including a transformer 316 having a primary winding 317 and a secondary winding 318 including winding portions 319 and 320, switch means 322 for opening and closing a current path through the transformer primary winding 317 and a current supplying means 324 coupled to the transformer primary winding 317. Switch means 322 comprises a switch 325 and a controller circuit 326. The transformer primary winding 317 is connected in series with a power source $V_b$, current supplying means 324 and the switch 325. A main portion 319 of the transformer secondary winding 316 is coupled across the base/emitter of the transistor 312 and a feedback portion 320 is coupled to the emitter of the transistor. The transformer secondary winding 318 generates signals to turn transistor 312 on and off in response to switching of switch 325.

The current supplying means 324 comprises a resistor 328 coupled between the voltage source $V_b$ and the primary winding 317, and a capacitor 330 coupled between ground and the connection of resistor 328 to the primary winding 317 so as to charge through the resistor 328 and discharge through primary winding 317 and switch 325. The switch 325 as controlled by controller circuit 326 opens and closes a current path through the primary winding 317 from the voltage source $V_b$. The secondary main winding portion 319 is coupled to the base of transistor 312 to turn it on and off in response to current flow in the primary winding 317 and the secondary feedback winding portion 320 is coupled across the base/emitter of transistor 312 to induce current in the secondary main winding portion 319 after the transistor has been turned on to maintain it turned on. Resistor 331 is coupled across the base/emitter of transistor 312 to damp out ringing energy associated with the switching activity. An unstabilized or raw DC voltage ("DC IN") is coupled to the collector of transistor 312, and the emitter of transistor 312 is coupled through secondary feedback winding portion 320 to a rectifier and filter 332 which provides a DC output voltage ("DC OUT") from the chopped voltage ("AC") produced at the emitter of transistor 312 as a result of switching transistor 312 on and off. The rectifier and filter 332 may include a transformer. The DC output voltage is fed back to the controller circuit 326 which controls switching of switch 325 to maintain the DC output voltage constant.

Switching of transistor 312 is accomplished as follows. When switch 325 is closed, current builds up in primary winding 317 as produced by the voltage across capacitor 330 and the inductance of the primary winding 317. This causes energy to be stored in the core of transformer 316. When switch 325 is opened, the energy stored in the core of transformer 316 induces current in the secondary main winding portion 319 which flows into the base of transistor 312 to turn it on. The secondary feedback winding portion 320 then provides positive feedback to the main winding portion 319 which maintains transistor 312 on with a base current essentially proportional to its collector current. During the time that switch 325 is opened, capacitor 330 is recharged from the voltage source $V_b$. When switch 325 is closed again, the voltage across charged capacitor 330 generates a reverse polarity voltage across primary winding 317 (the dot is considered as the positive reference). This produces a reverse voltage across the secondary main winding portion 319, which in turn provides a reverse voltage across the base/emitter of transistor 312 and a negative drive current to the base of transistor 312. While the voltage across capacitor 330 is self-adjusting by circuit operation so that the transformer 316 is not saturated, the voltage developed across capacitor 330 is too low for effective fast switching. As a result, the negative base current provided to transistor 312, which is induced as an effect of the voltage across and the current supplied by capacitor 330, builds up relatively slowly, and can delay turn-off of transistor 312. A problem is therefore presented in how to turn the transistor 312 off more quickly without saturating the transformer 316, without adversely affecting other performance characteristics of the switching circuit and essentially without increasing dissipation.

The invention provides such a solution which is easily implemented by only a few additional parts. Referring to FIG. 2, a switching circuit 310A according to the present invention is depicted which includes transistor 312 and rectifier and filter 332, as in switching circuit 310 of FIG. 1, and a controller means 314a which includes transformer 316, switch means 322 and first current supplying means 324, as in the FIG. 1 circuit. In addition, controller means 314a includes a second current supplying means 340 and a diode 342 coupling the first current supplying means 324 to the primary winding 317 of the transformer 316. The second current supplying means 340 comprises a resistor 344 coupled to the rectifier and filter circuit 332, and a capacitor 348 coupled between ground and the primary winding 318. A diode 346 is coupled between the resistor 344 and the primary winding 317. Resistor 344 of the second current supplying means 340 is coupled to and receives an unrectified and unfiltered voltage from the rectifier and filter 332. When transistor 312 is on and diode 346 is forward biased, the unrectified voltage is fed back through resistor 344 to charge capacitor 348 and to supply current to primary winding 317 as described below.

In operation, when switch 325 is closed, diode 342 becomes reverse biased and diode 346 conducts to provide a large turn-off current to the primary winding 317 of transformer 316 from the voltage on line 350 from the rectifier and filter 332, which voltage is much greater than the voltage across capacitor 330. As a result of this large current from the second current supplying means 340, transistor 312 turns off much more quickly than if only the first current supplying means 324 supplies turn-off current. When transistor 312 does turn off, the voltage on line 350 from the rectifier and filter 332 falls to approximately zero volts and causes diode 346 to become reverse biased and to decouple the rectifier and filter 332 from the transformer primary winding 317. At this time, capacitor 348 continues to supply turn-off current to transformer primary winding 317 for a short time until the voltage across capacitor 348 falls to a point which causes the voltage across capacitor 330 to forward bias diode 342. Diode 342 then conducts current from capacitor 330 in a manner similar to that described for the switching circuit 310 depicted in FIG. 1. Essentially, the behavior of the switching circuit 310 depicted in FIG. 1 is modified only during turn-off of transistor 312 when more energy is temporarily supplied to switch transistor 312 off. Thus, the circuit 310A dissipates essentially the same power as circuit 310, and circuit 310A does not degrade any of the performance characteristics of circuit 310. The invention therefore has a minimal effect on circuit 310, except when it is needed—to turn transistor 312 off more quickly.

Switch Mode Converter (FIGS. 3-6)

The switching circuit 310A is particularly suited for use as a switch mode converter in which transistor 312 is the primary switch. FIGS. 3-6 relate to use of a pair of switching circuits 310A controlled by a common controller circuit in a switch mode converter.

Figure 3:
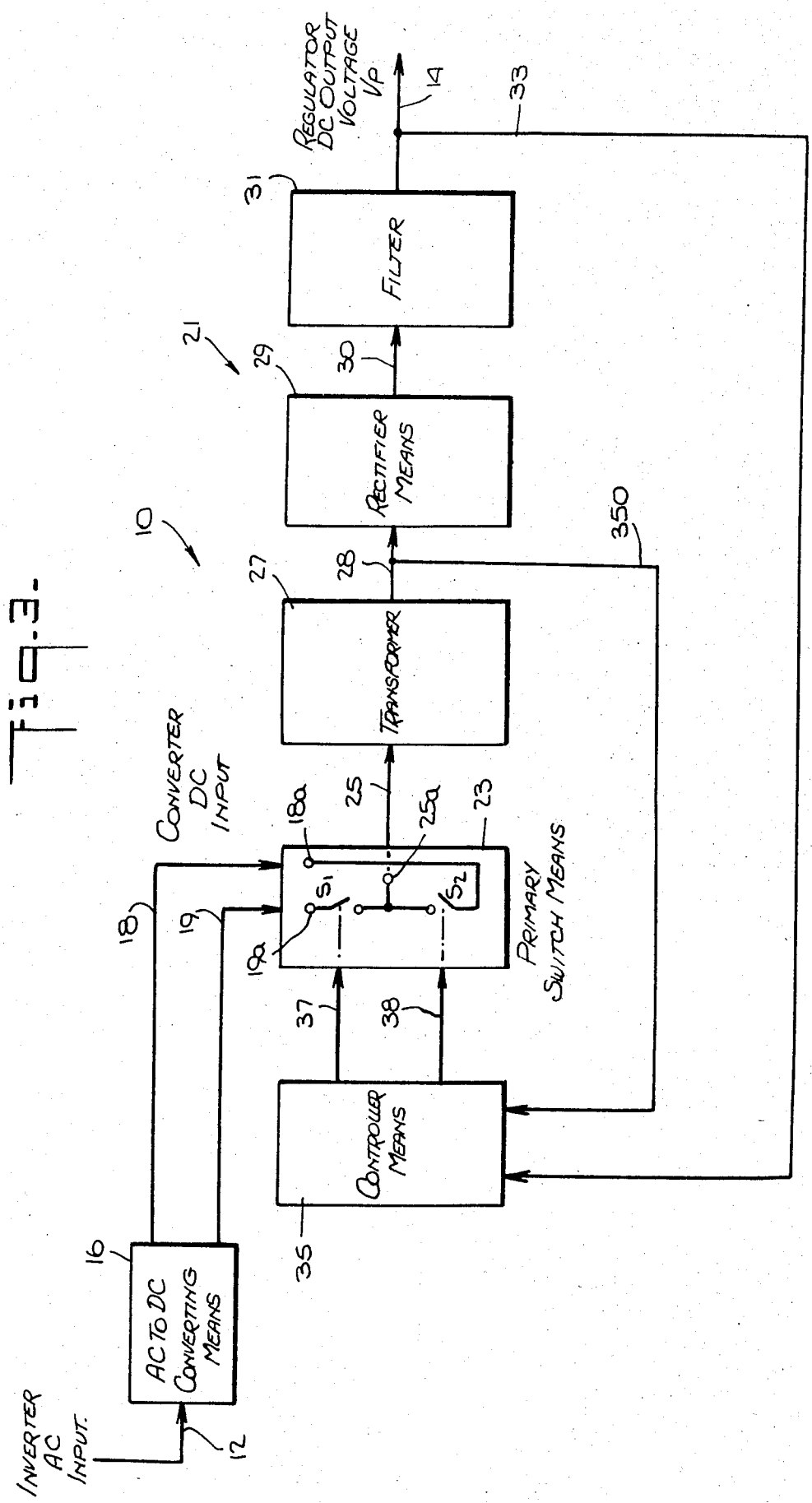
FIG. 3 is a block diagram of an AC to DC converter including a DC to DC switch mode converter according to the present invention which includes a pair of the switching circuits of FIG. 2 controlled by a common controller circuit.
Figure 5:
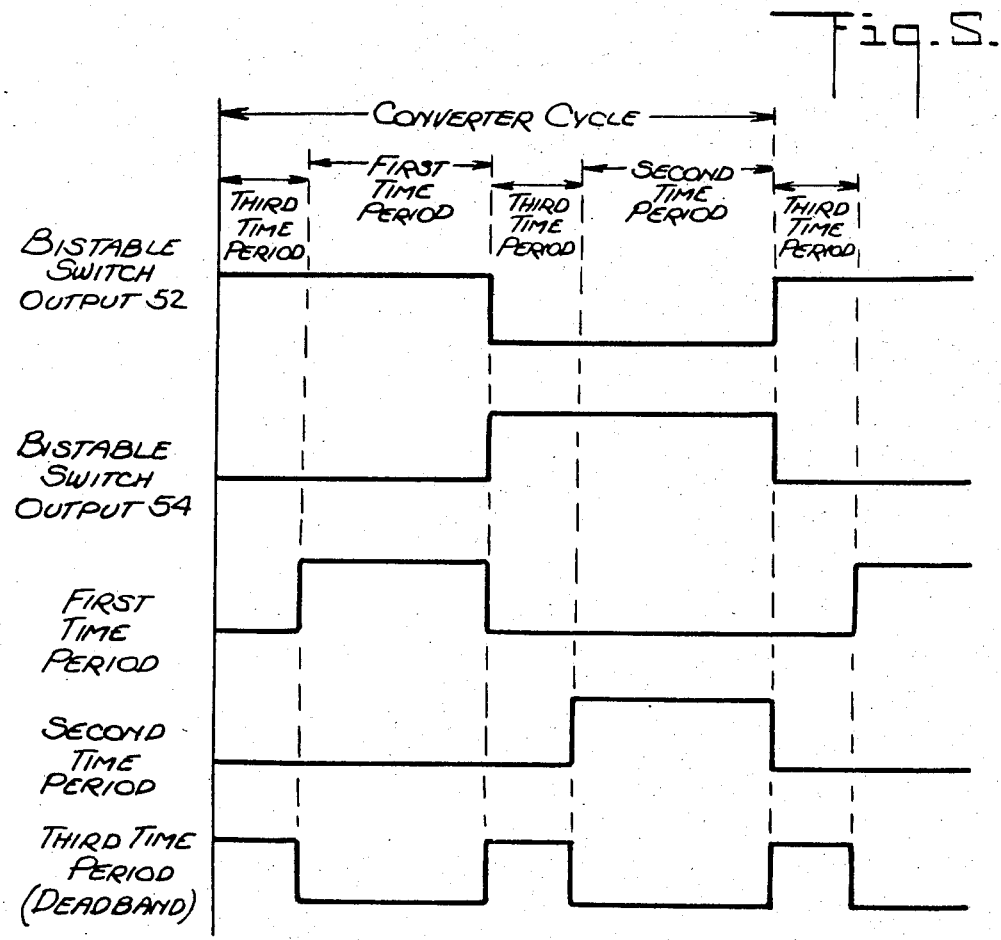
FIG. 5 is a diagram of a timing period generated in the converter depicted in FIG. 4.

Converter Block Diagram Description (FIGS. 3-5)

FIG. 3 depicts an AC to DC converter 10, which includes a pair of switching circuits 310A of FIG. 2 for converting an AC input voltage on line 12 to a regulated DC output voltage ("Vp") on line 14. The converter 10 includes AC to DC converting means 16 for providing a DC input voltage on lines 18 and 19 from the AC input voltage on line 12, and a DC to DC switch mode converter 21 for converting the DC voltage supplied on lines 18 and 19 to the regulated DC output voltage on line 14. The AC to DC converting means 16 can include protection, rectifying and filtering circuits, as well as transformers and energy storage circuits, all of which can be conventional and therefore will not be described further.

The DC to DC converter 21 in FIG. 3 includes a primary switch means 23 having first and second voltage inputs 18a, 19a coupled to lines 18 and 19, and an output 25a coupled to line 25, which chops the DC input voltage on lines 18 and 19 to convert it to an AC voltage on the switch means output 25a. The converter 21 also includes a transformer 27 which receives the AC voltage on line 25 and provides a voltage on line 28 stepped up or down to approximately the level desired for the regulated DC output voltage; a rectifier means 29 which rectifies the AC voltage on line 28 from the transformer 27 to provide a rectified voltage on line 30; and a filter 31 which filters the rectified voltage on line 30 from the rectifier means 29 to provide the DC output voltage on line 14. The DC voltage on line 14 is regulated by controlling the switch parameters of primary switch means 23, and line 33 couples the DC output voltage on line 14 to controller means 35, which varies the switching parameters of the primary switch means 23 so as to maintain the DC voltage output on line 14 at a constant, desired level.

Rectifier means 29 and filter 31 in FIG. 3 correspond generally to the rectifier and filter 332 of FIG. 2, and transformer 27 corresponds to a transformer which may be included in the rectifier and filter 332. The primary switch means 23 and controller means 35 in FIG. 3 correspond generally to a pair of transistors 312 with corresponding controller means 314a coupled thereto, except that a common controller circuit can be used instead of two FIG. 2 controller circuits 326, as described below. Also, the controller means 35 contains a second current supplying means 340, as in the controller means 314a of FIG. 2, which receives the voltage on line 350 from the transformer 27.

Figure 3A:
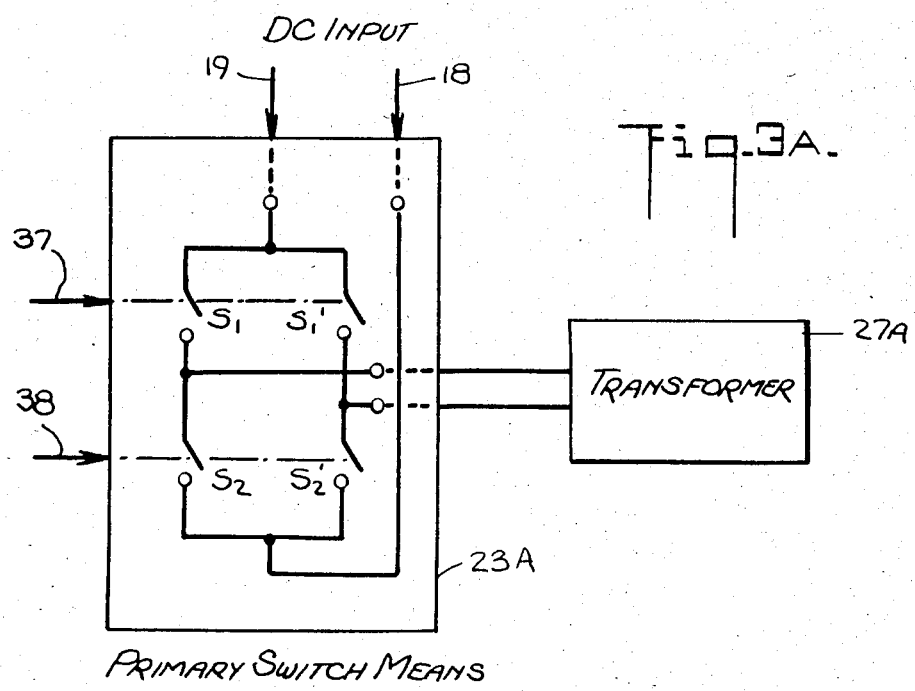
FIG. 3A is schematic diagram of another embodiment of the primary switches in the DC to DC converter depicted in FIG. 3.

The primary switch means 23 includes a pair of primary switches, e.g., transistors 312, designated $S_1$ and $S_2$, each of which is alternately switched on and off in response to control signals applied thereto from controller means 35. As depicted in FIGS. 3 and 4, switches $S_1$ and $S_2$ are coupled in a half bridge configuration. However, more than two primary switches can be coupled to the DC input voltage on lines 18 and 19, for example, in a full bridge configuration as depicted in FIG. 3A, where switches $S_1$ and $S_2'$ are switched on and off together, as are switches $S_2$ and $S_1'$. Connection of switches in half bridge, full bridge, push/pull and other configurations is known in the art and therefore will not be described further.

The switch parameter controlled by controller means 35 which essentially accounts for regulation of the DC output voltage on line 14 is the primary switch means duty cycle, i.e., the ratio expressed in percent of the total "on" time of switches $S_1$ and $S_2$ to the total period of the primary switch means. Controller means 35 supplies turn-on control signals on lines 37 and 38 to the control inputs of the primary switch means 23 which alternately turn on primary switches $S_1$ and $S_2$, and separates turn-on signals by a deadband to allow the last primary switch that was on to turn off before the next primary switch is turned on.

Referring now to FIG. 4, an embodiment of a DC to DC converter 21 is depicted in which the controller means 35 includes a free running oscillator 42, a bistable switch 44, logic and drive circuitry 46, error circuit 48 and feedback network 50. The controller means is coupled by lines 37, 38 to control inputs 37a, 38a of primary switches $S_1$ and $S_2$ to control the state of the primary switches.

The primary switch means 23, controller means 35, transformer 27, rectifier means 28, and filter 31 in FIG. 4 correspond to elements in circuit 310A of FIG. 2 as described above for FIG. 3. The logic and drive circuitry 46 of the controller means 35 contains the second current supplying means 340 of circuit 310A of FIG. 2 which receives the voltage on line 350 from the transformer 27.

Bistable switch 44 includes complimentary outputs 52, 54 which are always in the opposite logic state, i.e., "off"/"on" or logic "0"/logic "1" (FIG. 5), as controlled by signals supplied by oscillator 42 to the bistable switch 44 on its input 56. The outputs 52, 54 of the bistable switch 44 are thus toggled by the oscillator 42 so that one bistable switch output is always in an on state. This toggling action can conveniently be thought of as a "steering control" for enabling a signal directing turn on (i.e., a turn-on signal) of primary switches $S_1$, $S_2$ to be generated on only one of lines 37 and 38 at any one time. In order to regulate the DC output voltage provided on line 14, the duty cycle of the signals being provided on either line 37 or 38 to the primary switch means 23, as "steered" by the bistable switch 44, is varied by the logic and drive circuitry 46 based on an error signal provided on line 58 by the error circuit 48. The error signal is supplied by the error circuit 48 to the logic and drive circuitry 46 from a feedback signal provided by the feedback network 50 on line 60 and a reference voltage provided to the error circuit 48 on line 62.

Referring to FIGS. 4 and 5, the bistable switch 44 establishes a first time period when one of its outputs (e.g., 52) is high and a second time period when the other of its outputs (i.e., output 54) is high. During part of the time that each of the bistable switch outputs 52, 54 is high, a third time period or deadband is generated which separates adjacent first and second time periods. A converter cycle is defined by two toggles of the bistable switch 44, i.e., the time period during which an output 52, 54 experiences two level changes. During a converter cycle, one first time period, one second time period and two third time periods are generated, with a third time period separating each first and second time period. During the first time period, the logic and drive circuitry 46 provides turn-on control signals only to one of the primary switch means control inputs (e.g., input 37a) and during the second time period provides turn-on control signals only to the other of the primary switch means control inputs (i.e., input 38a). During the third time period, no turn-on signals are generated. The timing and duration of individual turn-on signals output by the controller means to control inputs 37a and 38a are determined by the level of the DC voltage on line 14 which is fed back to the controller means 35 on line 33, as will be described below.

Deadband time periods of minimum duration are provided separating consecutive first and second time periods to ensure that switches $S_1$ and $S_2$ are both off before the next turn-on signal is supplied. The deadbands are derived from a blanking signal applied by the oscillator 42 on line 64 to the logic and drive circuitry 46, which causes the logic and drive circuitry 46 to supply turn-off contol signals to primary switch means control inputs 37a and 38b directing that the primary switches $S_1$ and $S_2$ both simultaneously be turned off. The blanking signal is also applied to the bistable switch 44 (line 56) and toggles it. The blanking signal is selected to take into account the delay times associated with turning the primary switches $S_1$ and $S_2$ off and to maintain switch turn-off signals on both of control inputs 37a and 38a longer than these delay times for all operating conditions of the converter 21. The blanking signal thereby causes the logic and drive circuitry 46 to limit the maximum duty cycle at which the primary switch means 23 can be operated. The lower the maximum duty cycle at which primary switch means 23 is permitted to operate, the greater the safety factor in ensuring that primary switches $S_1$ and $S_2$ will not be on simultaneously.

Figure 6:
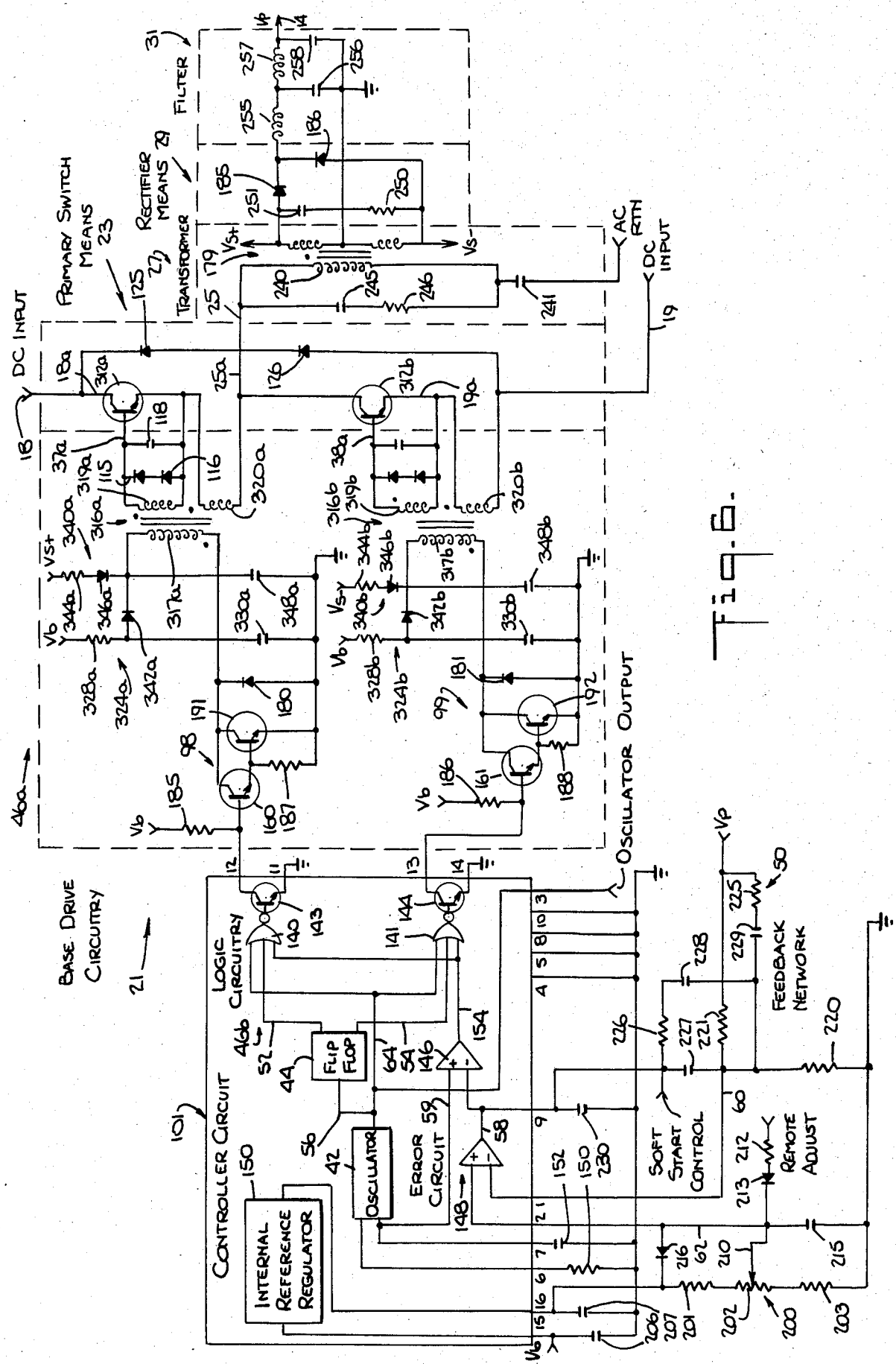
FIG. 6 is a schematic diagram of the DC to DC converter depicted in FIG. 5.

Converter Circuit Description (FIG. 6)

A more detailed description of the converter 21 will be made with reference to FIG. 6. The converter 21 depicted in FIG. 6 can provide a primary output voltage $V_p$ on line 14 of, for example, 5 v.

Primary Switch Means 23

The primary switch means 23 comprises primary transistor switches 312a, 312b (each of which correspond to transistor 312 in FIG. 2) coupled to the DC voltage lines 18 and 19 from the AC to DC converting means 16 (FIG. 3). The voltage input 18a to primary transistor switch 312a is its collector, which is coupled to DC input voltage line 18, and the voltage input 19a to primary transistor switch 312b is its emitter, which is coupled to DC input voltage line 19 through feedback winding portion 320b of transformer 316b. Transistors 312a, 312b function as the primary converter switches to alternately switch the DC input voltage on lines 18 and 19 (e.g. +150 V, −150 V derived from a 115 V AC input) to the common output 25a of the primary switch means 23. The transistors 312a, 312b are coupled to base drive circuitry 46a (part of logic and drive circuitry 46 in FIG. 4), which includes transformers 316a, 316b and Darlington circuits 98, 99 (which correspond to a pair of switches 325 in FIG. 2). The Darlington circuits 98, 99 are coupled to a controller circuit 101, (which corresponds to controller circuit 326 in FIG. 2, but controlling two Darlington circuits) and the transformers 316a, 316b (which correspond to transformer 316 in FIG. 2) couple the Darlington circuits 98, 99 to the bases 37a, 38a (control inputs) of transistors 312a, 312b respectively.

The controller circuit 101 includes part of the logic and drive circuitry 46 (FIG. 4), i.e. the logic circuitry 46b, as well as the oscillator 42, the flip-flop (bistable switch) 44 and the error circuit 48 of the controller means 35 in FIG. 4. The controller circuit 101 can be and preferably is a pulse width modulator, integrated circuit, which is available from Silicon General, Inc. of Garden Grove, Calif. as model SG1524, or its equivalent. The model SG1524 includes elements in addition to those depicted in FIG. 6, but these additional elements have not been shown for clarity. However, the terminals of the SG1524 pulse width modulator have been designated in FIG. 6 thereby enabling one of skill in the art to connect it or its equivalent into the circuit depicted in FIG. 6.

Transistors 312a and 312b operates as saturated switches to alternately couple the DC input voltage on lines 18 and 19 to the output transformer 27. This operation places an AC voltage across the output transformer 27 having a frequency (e.g. 20 Khz) equal to the frequency of the primary switch means 23 and an amplitude related to the DC input voltage on lines 18 and 19 (which in turn is related to the AC input voltage to the inverter means 16). The "on" duty cycle of transistors 312a and 312b is such that the voltseconds impressed across the output of transformer 27 can be varied to produce a regulated DC output voltage on line 14 for a wide range of AC inputs to the inverter means 16 and a wide range of load conditions at the output 14.

Base Drive Circuitry 46a and Primary Switch Means 23

Transformer 316a controls transistor 312a and transformer 316b controls transistor 312b. Each of these transformers 316a, 316b includes a primary winding 317a, 317b coupled to a respective Darlington circuit 98, 99, a secondary main winding 319a, 319b coupled between the base and emitter of the respective transistor 312a, 312b and a secondary feedback winding 320a, 320b. Feedback winding 320a is coupled to the secondary main winding 319a of transformer 316b and to the common output 25a of the primary switch means. Feedback winding 320b is coupled to the secondary main winding 319b of transformer 316b and to the DC input line 19.

Transistor 312a is switched on as follows. When the primary winding 317a of transformer 316a is conducting, current flows out of the dot side of the winding (into the dot is considered positive current flow), and transistor 312a is back biased and held in the off state.

During this time a flux density is established in the core of the transformer 316a and the core stores energy. Since the flux in the core cannot change instantaneously, when current in the primary winding 317a of transformer 316a is interrupted, the energy stored in the core forces current to flow in the transformer secondary main winding 319a in an attempt to maintain flux continuity. Since current flow was out of the dot side in the transformer primary winding 317a, it is also out of the dot side in the transformer secondary main winding 319a and into the base of transistor 312a. This turn-on current causes transistor 312a to become forward biased and current to flow into the dot side of the feedback winding 320a of transformer 316a. The current into the base of transistor 312a must increase in order to maintain continuity of the flux as the collector/emitter current of transistor 312a flowing through the feedback winding 320a increases. This operation describes the basic principal of proportional base drive, i.e., the base drive current increases as the collector current increases. The ratio of base current increase to collector current increase is generally the turns ratio of the secondary main and feedback windings 320a, 320b of transformer 316a, noting that base current also results from the core energy, so that the base current is somewhat more than the ratio of the turns of these transformer windings. A high on control input 37a from secondary main winding 319a therefore turns transistor 312a on.

To turn transistor 312a off, a large current is forced to flow out of the dot side of the primary winding 317a of transformer 316a, i.e., a negative voltage is applied across the primary winding 317a. The response in the transformer secondary main winding 319a attempts to maintain the continuity of the flux as described for the turn-on of the transistor 312a. Since the collector current of transistor 312a is set by the load on line 14, the only current that can change is the base current of transistor 312a which is forced to flow out of the base of transistor 312a. After the charge stored in transistor 312a is depleted, it turns off, the current in the feedback winding 320a is reduced to zero and the current in the primary winding 317a is greatly reduced to maintain the continuity in the flux. For the balance of the primary switch means cycle, the base/emitter junction of transistor 312a is back biased or perhaps slightly forward biased, and transistor 312a is off. A negative voltage or low on control input 37a turns transistor 312a off. Switching of primary transistors 312a and 312b will be discussed in more detail below.

Diodes 115 and 116 between the base and emitter of transistor 312a replace resistor 331 in FIG. 2 and prevent the negative voltage applied across the base/emitter from becoming excessive. These diodes also assist transistor 312a in recovering from ringing that may occur at the base of transistor 312a as a result of parasitic reactances. Capacitor 118 connected between the base and emitter of transistor 312a controls such ringing and also filters out the parasitic effects of switching transistor 312b on and off.

Transistor 312b is coupled to transformer 316b in a manner similar to the coupling of transistor 312a and transformer 316a, and the switching operation of transistor 312b is similar to that of transistor 312a described above.

Diode 125 is coupled between the collector of transistor 312a and the output of feedback winding 320a (the common output 25a of primary switch means 23), and diode 126 is coupled between the collector of transistor 312b and the output of feedback winding 320a (DC input voltage line 19). These diodes clamp the voltage generated across the respective transistor by release of the energy stored in the leakage inductance of the output transformer 27 when a respective transistor 312b, 312a is turned off.

Controller Circuit 101 and Base Drive Circuitry 46a

The controller circuit 101 includes oscillator 42, flip-flop 44, NOR gates 140, 141, output transistors 143, 144, comparator 146, error amplifier 148 and internal reference voltage regulator 150. The oscillator 42 generates narrow clock pulses at twice the frequency of the primary switch means 23 (e.g., at 40 Khz), which are fed to flip-flop 44 and to one input of each of NOR gates 140, 141. The outputs of the NOR gates 140, 141 are coupled to the bases of transistors 143, 144 respectively, and the collectors and emitters of transistors 143, 144 are provided as outputs of the controller circuit 101 at terminals 11–14. Timing signals which determine the first, second and third time periods referred to above are output by transistors 143 and 144 on terminals 12 and 13 as determined by the states of NOR gates 140, 141 and flip-flop 44. One complementary output 52 of flip-flop 44 is coupled to a second input of NOR gate 140 and the other output 54 of flip-flop 44 is coupled to a second input of NOR gate 141. The output of the comparator 146 is fed to a third input of each of NOR gates 140 and 141. Coupled to the oscillator 42 via terminals 6 and 7 respectively are an external resistor 150 and an external capacitor 152 which determine the basic timing of the oscillator 42 (e.g., 40 Khz). The oscillator 42 establishes a constant charging current into the capacitor 152 to produce a linear ramp voltage across the capacitor 152.

The output from the oscillator 42 (lines 56 and 64) is a narrow clock pulse (blanking pulse) which occurs each time the external capacitor 152 is discharged. This narrow blanking pulse on line 64 causes the outputs of both NOR gates 140 and 141 to go low, thereby turning output transistors 143 and 144 off for the duration of the pulse and ensuring that primary transistors 312a and 312b are not on simultaneously during transitions of the oscillator output. The width of this blanking pulse can be controlled to some extent by the values selected for the external capacitor 152 and resistor 150, and can be, for example, 0.5 us for a 40 Khz clock rate. The narrow blanking pulses are supplied to flip-flop 44 on line 56, which divides the operating frequency of the oscillator 42 in half.

A high at output 52 of flip-flop 44 to NOR gate 140 turns transistor 143 off regardless of the logic state of the other inputs to NOR gate 140. This corresponds to the half cycle of primary switch means 23 in which transistor 312a is off. A low at the output 52 of flip-flop 44 to NOR gate 140 enables transistor 143 to be turned on in accordance with the output of comparator 146, i.e. in accordance with the DC output voltage on line 14, except when a blanking pulse (high) is supplied by oscillator 42 on line 64 during the deadband period. This corresponds to the half cycle of the primary switch means 23 in which transistor 312a is turned on in accordance with the state of the DC output voltage on line 14. Flip-flop 44, NOR gate 141 and transistor 144 operate in a complementary manner.

The error amplifier 148 is a differential amplifier which provides an error output on line 58 proportional to the difference between error and reference signals applied to its input via terminals 1 and 2 of the controller circuit 101. The error output of the error amplifier 148 is compared in comparator 146 with the ramp voltage on line 59 generated across external capacitor 152, and the comparator 146 provides a logic signal on line 154 to NOR gates 140, 141 which overrides the flip-flop outputs 52, 54 to drive the outputs of NOR gates 140, 141 low and turn transistors 143 and 144 off.

The controller circuit 101 includes an internal reference voltage regulator 150 used to generate a reference voltage on terminal 16 and a regulated voltage for use by circuitry internal to the controller circuit 101.

Further details regarding operation of the model SG1524 pulse width modulator are set forth in publications available from Silicon General, Inc.

The signals output from controller circuit 101 are fed to base drive circuitry 46a to control the primary transistor switches 312a, 312b. The collector of transistor 143 (terminal 12) is coupled to the base of transistor 160 of Darlington circuit 98 and the collector of transistor 144 (terminal 13) is coupled to the base of transistor 161 of Darlington circuit 99. Each of the Darlington circuits 98, 99 is connected between the dot side of the primary winding 317a, 317b of transformers 316a, 316b, respectively, and ground. The other side of each of the primary windings 317a, 317b is coupled to a first current supplying means 324a, 324b (each corresponding to first current supplying means 324 in FIG. 2) and a positive source of voltage, specifically a bias voltage $V_b$. Each first current supply means 324a, 324b comprises a resistor 328a, 328b and a capacitor 330a, 330b coupled to the respective resistors 328a, 328b. Capacitors 330a, 330b are charged from the bias voltage $V_b$. The bias voltage $V_b$ can be generated by components (not shown) coupled to the AC to DC converting means 16, and/or to the converter 21, or generated by components not associated with the converter 21 and converter 10. For example, $V_b$ can be 12 V DC.

The side of each of the transformer primary winding 318a, 317b coupled to $V_b$ is also coupled to a second current supplying means 340a, 340b (each corresponding to second current supplying means 340 in FIG. 2) which is coupled to the unrectified, primary voltage Vs+, VS− from the secondary winding 179 of transformer 27. Each second current supplying means 340a, 340b comprises a resistor 344a, 344b and a capacitor 348a, 348b. Voltages Vs+ and Vs− correspond to the voltage on line 350 in FIGS. 2-4. Diodes 342a, 342b and 346a, 346b (which correspond to diodes 342 and 346 in FIG. 2) prevent cross-conduction between the two respective current supplying means. Capacitors 348a, 348b are coupled to respective diodes and are charged from the unrectified voltages Vs+ and Vs− from the secondary winding 179 of transformer 27.

Resistors 185, 186 coupled to the Darlington circuits provide biasing for the Darlington circuits derived from the bias voltage $V_b$. Resistors 187 and 188 provide bias current for Darlington transistors 160 and 161.

Controller circuit 101 controls the current in the primary windings 317a, 317b of transformers 316a, 316b to produce a regulated DC output on line 14 as follows. During one half cycle of the primary switch means 23, terminal 12 of the controller circuit 101 is forced high to provide a turn-off control signal to primary transistor switch 312a and turn it off. A high on terminal 12 turns on the Darlington circuit 98 and couples the dot side of primary winding 317a essentially to ground, which causes current to flow through primary winding 317a and turn primary transistor switch 312a off. During this same half cycle, after the deadband period, terminal 13 is forced low to provide a turn-on signal to primary transistor switch 312b. (A low at terminal 13 switches the Darlington circuit 99 off and blocks current flow through primary winding 317b, which causes transistor 312b to be turned on.) Transistor 312b remains on until terminal 13 is again forced high in accordance with AC input and load conditions, to provide a turn-off control signal to transistor 312b to turn it off. During the other half cycle, the process is reversed, and terminal 13 is forced high to turn on the Darlington circuit 99, which causes generation of a turn-off signal to turn transistor 312b off, and, after termination of the deadband period, terminal 12 is forced low to turn Darlington circuit 98 off, which causes generation of a turn-on signal to turn transistor 312a on. In the deadband period during blanking pulses, terminals 12 and 13 are both forced high, the Darlington circuits 98, 99 are both switched on, and turn-off signals are generated to turn transistors 312a, 312b off.

When terminal 12 of the controller circuit 101d is high, then Darlington circuit 98 will be on with current flowing out of the dot side of the primary winding 317a of transformer 316a. The DC voltage across capacitor 330a charged from the bias voltage $V_b$ produces a negative voltage across the transformer primary winding 317a and keeps transistor 312a in the off state. The magnetizing current flowing in the transformer primary winding 317a reflects how much energy is stored in the core of transformer 316a.

The value of capacitor 330a is such that there is very little change in the voltage across it during normal operation. When the Darlington circuit 98 is off, the charge on capacitor 330a is restored from the bias voltage $V_b$ by conduction through resistor 328a.

At this time, diode 342a is back-biased. When the Darlington circuit 98 is on, then charge is removed from capacitor 330a through diode 342a and the transformer primary winding 317a. For the average voltage across transformer primary winding 317a to be zero, the average voltage across capacitor 330a is varied as the duty cycle changes, but not enough to alter the basic converter operation.

Voltages Vs+ and Vs− from the secondary winding 179 of transformer 27 are fed back via the second current supplying means 340a, 340b to the base drive circuitry 46a to assist in turning transistors 312a, 312b off. After the Darlington circuit 98 has been turned on by a high level at terminal 12, and transistor 312a has been turned off, the collectors of the Darlington transistors 160, 191 are essentially at ground potential and the dot side of the primary winding 317a of transformer 316a is at essentially zero volts. Diode 346a is reverse biased and the other side (opposite the dot) of the primary winding 317a is essentially at the same potential as capacitor 330a. Magnetizing current then flows in the primary winding 317a as set by the voltage at capacitor 330a and the length of time that this voltage is impressed across winding 312a. When terminal 12 goes low, the Darlington circuit 98 is turned off and its output is open, thereby preventing the magnetizing current from flowing in transformer 316a and turning transistor 312a on as described above. As the secondary 179 of transformer 27 responds, Vs+ rises and charges capacitor 348a through resistor 344a and diode 346a very quickly with a large current, e.g., 1 A. As long as transistor 312a is on, Vs+ is high. During this time, diode 342a is reverse biased and capacitor 330a is effectively discontinued from the base drive circuit 46a but charged through resistor 328a.

To turn transistor 312a off again, terminal 12 of the controller circuit 101 is forced high to turn the Darlington circuit 98 on. The dot side of the primary winding 317a of transformer 316a is then clamped at about zero volts, as described above. This causes a large current flow out of the dot of the primary winding 317a and absorbs all of the ampere turns produced by the feedback winding 320a and causes the primary 317a to demand even more current. The only place to get more ampere turns and hence more current is out of the base of transistor 312a. Such current, i.e., reverse base or turn-off current, can only flow out of the base of transistor 312a as long as charge is stored in its base. Since transistor 312a has not yet turned off, Vs+ from the secondary winding 179 of the transformer 27 is high which provides a much greater voltage to induce turn-off current out of the base of transistor 312a than if the first current supplying means 324a (bias voltage $V_b$, resistor 328a and the capacitor 330a) is relied on solely. This large voltage derived from Vs+ enables the second current supplying means 340a to cause a rapid buildup of current in the primary winding 317a of transformer 316a which provides turn-off current to the base of transistor 312a.

Because of storage time in transistor 312a, it takes considerable time for the charge in transistor 312a to be depleted and for transistor 312a to turn-off, for example, as long as 3 us. During this time the voltage Vs+ remains high and provides turn-off drive via the second current supplying means 340a. When the charge is finally depleted and transistor 312a turns off, the voltage Vs+ at the secondary winding 179 of transformer 27 falls, diode 346a is reverse biased and the voltage on the capacitor 340a of the second current supplying means 340a provides the final thrust of drive current to complete the turn-off process and then diode 342a forward biases and capacitor 330a of the first current supplying means 324a keeps transistor 312a reverse biased during the balance of the converter cycle. The voltage across capacitor 330a keeps the transistor 312a off until the next time it is to be turned on. During this time, the magnetizing current of transformer 316a recovers so that the next cycle can begin.

Transistor 312b operates in a similar manner with Vs− being supplied to the primary winding 317b of transformer 316b via resistor 344b, diode 346b and capacitor 348b.

Primary Voltage $V_p$ Output Adjustment

The controller circuit 101 includes an internal reference regulator 150 which receives the bias voltage $V_b$ on terminal 15 and provides a regulated voltage to internal circuits of the controller circuit 101. The internal reference regulator 150 also provides a reference voltage output (e.g., 5 v DC) on terminal 16. The voltage supplied as a reference to the non-inverting input of error amplifier 148 (terminal 2) is derived from the internal reference regulator 150 output voltage on terminal 16 by the resistive divider reference network 200 comprised of resistor 201, potentiometer 202 and resistor 203. Capacitors 206 and 207 are filter capacitors. An adjustable voltage is obtained from the internal reference voltage on terminal 16 at the wiper arm 210 of potentiometer 202 and supplied to the non-inverting input of error amplifier 148 via terminal 2. Adjustment of potentiometer 202 adjusts the primary output voltage Vp on output line 14.

The primary output voltage $V_p$ on line 14 can also be adjusted remotely via resistor 212 and diode 213 series coupled to controller circuit 101 terminal 2. Thus, the error amplifier reference voltage provided by potentiometer 202 can be overridden by a voltage (remote adjust) applied to terminal 2 via resistor 212 and diode 213. Capacitor 215 coupled from the potentiometer wiper arm 210 to ground provides filtering and diode 216 coupled between the non-inverting input of the error amplifier 148 (terminal 2) and the output of the internal reference voltage regulator 150 (terminal 16) limits the maximum voltage that can be applied to the error amplifier to that of the output of the reference voltage regulator 150.

Feedback Network 50

Feedback network 50 is provided from the primary voltage output $V_p$ on line 14 to the controller circuit 101 to cause the controller circuit to regulate the primary output voltage. More specifically, the primary output voltage $V_p$ from line 14 is divided down by a feedback circuit comprised of resistors 220 and 221 to a voltage equal to the reference voltage obtained by the divider network 200 at terminal 2 when the primary voltage $V_p$ is set at its desired level. This feedback voltage is applied via line 60 to the non-inverting input of error amplifier 148 (terminal 1 of controller circuit 101).

In addition, a loop compensation circuit comprised of resistors 225 and 226 and capaciitors 227–229 couples the primary output voltage Vp on line 14 to the controller circuit 101 (inverting input of error amplifier 148 via terminal 1 and inverting input of comparator 146 via terminal 9) to provide for optimal response to load transients while maintaining good loop stability. Capacitor 230 connected to terminal 9 is a filter capacitor.

If there is any error in the primary voltage output $V_p$ on line 14, this is manifested in the signal supplied to the inverting input of comparator 146 from error amplifier 148, which modifies the duty cycle of the controller circuit 101 output, and consequently that of the primary switch means 23.

A soft start control can be coupled to terminal 9 which applies ground potential to terminal 9 when power is first turned on and gradually allows the voltage at terminal 9 to rise until the feedback network 50 takes control. The soft start control can also be activated during malfunctions (e.g. over voltage, over current) in the operation of the converter 21 and in any auxiliary components (e.g. those generating the bias voltage, reference voltage and auxiliary voltages).

In addition, terminal 3 (oscillator output) of the controller circuit 101 can be used for monitoring and control purposes.

Transformer 27, Rectifier Means 29 and Filter 31

The primary winding 240 of transformer 27 on one side is coupled via line 25 to the output 25a of the primary switch means 23, and on the other side to an AC return (AC RTN) to the AC to DC converting means 16 (FIG. 1) through capacitor 241. Capacitor 241 insures that there is no DC component across the primary winding 240 of transformer 27 and absorbs any DC voltage that may be generated, thereby maintaining the average voltage across the primary winding 240 at zero.

The transformer 27 includes primary winding 240 and secondary winding 179, and may include further primary windings and secondary windings (not shown) for auxiliary voltages (not shown). Primary switch means 23 drives the primary winding 240 of output transformer 27 back and forth between the DC input voltages on lines 18 and 19 at the converter switching rate and in response thereto secondary winding 179 provides voltages to the rectifier means 29. Secondary winding 179, which has a grounded center tap, is conventionally coupled to rectifier diodes 185 and 186 and supplies the voltages Vs+ and Vs− for the respective second current supplying means 344a, 344b.

As mentioned previously, there is considerable energy stored in the leakage inductance of the transformer 27 at the time that the primary transistor switches 312a, 312b turn off. Since that energy cannot be transferred instantaneously, the current in the transformer primary winding 240 seeks to remain constant right after turn off of transistors 312a, 312b. At the same time, current flow into the base of the transistors 312a, 312b must be terminated if the transistors are to be turned off. The primary winding 240 of transformer 27 and transistors 312a, 312b therefore tend to oppose each other during transistor turn off, which tends to cause high voltage and current simultaneously in transistors 312a, 312b.

The energy stored in the output transformer 27 leakage inductance must be transferred before the voltage at the primary winding 240 of transformer 27 can settle into a steady state value of essentially zero volts. This inductance, and stray capacitance at the primary winding 240 contributed mainly by the switching transistors 312a, 312b, form a tank circuit which will ring indefinitely if there is nothing to absorb the energy supplied to it. Most of the energy stored in the leakage inductance of transformer 27 is transferred back to the DC source supplying the DC input voltage on line 18 when transistor 312a is turned off, and any remaining energy is dissipated by a snubber network comprised of capacitor 245 and resistor 246 connected in series across the transformer primary winding 240. When transistor 312a is turned off, diode 125 becomes forward biased and permits energy stored in the leakage inductance of the transformer 27 to be transferred to the DC input line 18. Shortly after transistor 312a is turned off, current flow out of the transformer primary winding 240 ceases and diode 125 becomes reverse biased. At this time, the snubber network damps ringing in the tank circuit and dissipates energy stored in stray and parasitic capacitances associated with the primary winding 240 of transformer 27 and elements coupled thereto. Resistor 246 serves as an energy absorbing device to damp out the ringing. Resistor 246 also limits the current in the tank circuit when either of the primary transistor switches 312a, 312b turns on, otherwise there could be a very large switching current through the capacitor 245.

Another snubber circuit comprising resistor 250 and capacitor 251 is connected in series across the secondary winding 179 of transformer 27. This snubber network is provided because of the leakage inductance of the secondary 179 which presents a problem when either end of the primary winding 240 is driven by a respective transistor 312a, 312b. During the time that the primary winding 240 is not being driven by the transistor switches 312a, 312b, the transformer secondary winding 240 is in an idle state. However, the energy stored in the transformer 27 ensures that the current in the inductor 255 in the filter 31 is continuous, and rectifier diodes 185 and 186 each provide a portion of the required current to the inductor 255. It should be mentioned that the current in rectifier diodes 185, 186 does not divide equally because of the magnetizing current of the output transformer 27 and due to the magnetics involved. When the primary winding 240 of transformer 27 drives the secondary winding 179, one rectifier diode must be turned off and the other turned on. The leakage inductance of the transformer secondary winding 179 prevents that from happening instantaneously. Even though the primary winding 240 is driven high, essentially no voltage appears across the secondary winding 179 until the current in one rectifier diodes 185, 186 has been reduced to zero, then the voltage across the secondary winding 179 begins to fall. However, because of the rather large junction capacity of the rectifier diodes 185, 186 the voltage across the secondary winding 179 cannot change instantaneously. This makes the capacitance of the rectifier diodes and the transformer leakage inductance look like an LC tank circuit which stores considerable energy. The purpose of the snubber network comprised of resistor 250 and capacitor 251 is to absorb that energy and damp the ringing without exceeding the voltage rating of the rectifiers diodes 185, 186.

Inductor 255, capacitor 256, inductor 257 and capacitor 258 form the filter 31 for the primary DC output voltage provided to line 14.

While the invention has been illustrated in connection with converters utilizing a pair of primary switches, the invention can be utilized in a converter having one primary switch. In such a one-primary switch converter, the switching circuit for the one primary switch can be generally the same as that for one of the switches of a two primary switch converter, with certain modifications being made in order to switch one switch on and off instead of two.

Certain changes and modifications of the embodiments of the invention disclosed herein will be readily apparent to those skilled in the art. For example, the particular voltages and current values given are exemplary and are not intended to limit the scope of the invention. In addition, the primary switch transistors could be coupled to drive circuitry and output circuitry in manners other than those depicted, the primary switches could be devices other than transistors and the primary switch means can comprise more or less than two primary switches. Also, the first and second current supplying means can have circuit configurations other than those specfically illustrated, and the controller means is not limited to one which includes the model SG 1524 integrated circuit or the specific circuitry depicted in the drawings. It is the applicant's intention to cover by the claims all those changes and modifications which could be made to the embodiments of the invention herein chosen for the purpose of disclosure without departing from the spirit and scope of the invention.

What is claimed is:

1. A switching circuit comprising a first switch and controller means for switching the first switch on and off:

the first switch having a first input adapted to be coupled to an input voltage, a second input, and an ouput and being switchable between on and off states for respectively coupling and decoupling the input voltage at the first input to the output in response to signals supplied by the controller means to the second input;

the controller means comprising:

a transformer having a primary winding and a secondary winding, the secondary winding being coupled to the second input of the first switch and supplying said signals to the second input of the first switch;

first current supplying means coupled to the primary winding of the transformer for supplying current to the transformer primary winding;

second current supplying means coupled to the output of the first switch and to the primary winding of the transformer for supplying current to the transformer primary winding from the input voltage when it is coupled to the output of the first switch in the on state of the switch; and switch means coupled to the primary winding of the transformer for selectively permitting and preventing current flow through the transformer primary winding;

the transformer and the first and second current supplying means cooperating to switch the first switch from the on state to the off state when the switch means permits current to flow through the transformer primary winding and to maintain the first switch in the off state while current is permitted to flow in the transformer primary winding, and to switch the first switch back to the on state when the switch means prevents current from flowing through the transformer primary winding and to maintain the first switch in the on state while current is prevented from flowing, the second current supplying means supplying current to the transformer primary winding when the first switch is in the on state during only an initial portion of the time in which current is permitted to flow in the transformer primary winding effective to cause the transformer to switch the first switch from the on state to the off state, and the first current supplying means supplying current at least after said initial portion of the time during which current is permitted to flow in the transformer primary winding effective to cause the transformer to maintain the first switch in the off state and to enable the transformer to switch the first switch back to the on state when current is next permitted to flow in the transformer primary winding.

2. The circuit according to claim 1 wherein the first current supplying means comprises a first resistor adapted to be coupled to a source of energy and coupled to the transformer primary winding, and a first capacitor coupled to the first resistor and to the transformer primary winding so as to be charged through the first resistor from the source of energy and discharged through the transformer primary winding, and wherein the second current supplying means comprises a second resistor coupled to the output of the first switch and coupled to the transformer primary winding, and a second capacitor coupled to the second resistor and to the transformer primary winding so as to be charged through the second resistor from the output of the first switch and discharged through the transformer primary winding, the controller means including means for blocking the flow of current between the first and second current supplying means.

3. The circuit according to claim 2 wherein the current blocking means comprises a first diode coupled between the first current supplying means and the transformer primary winding and a second diode connected between the second current supplying means and the transformer primary winding.

4. The circuit according to claim 3 wherein the first switch is a transistor having its base coupled to the transformer primary winding, its collector adapted to be coupled to the input voltage and its emitter coupled to the first switch output.

5. The circuit according to claim 4 wherein the transformer secondary winding comprises two winding portions, a main portion being coupled to the base of the transistor and a feedback portion being coupled to the emitter of the transistor, the transformer being configured and connected so that the feedback portion induces current in the main portion after the transistor has switched to its on state to thereby maintain the transistor in its on state.

6. The circuit according to claim 5 wherein the second resistor is coupled to the emitter of the transistor.

7. The circuit according to claim 1 wherein the first switch is a transistor having its base coupled to the transformer primary winding, its collector adpated to be coupled to the input voltage and its emitter coupled to the first switch output.

8. The circuit according to claim 7 wherein the transformer secondary winding comprises two winding portions, a main portion being coupled to the base of the transistor and a feedback portion being coupled to the emitter of the transistor, the transformer being configured and connected so that the feedback portion induces current in the main portion after the transistor has switched to its on state to thereby maintain the transistor in its on state.

9. The circuit according to claim 2 wherein the values of the second resistor and the second capacitor are selected such that current is supplied from the output of the first switch during said initial portion when the switch is on, and thereafter when the first switch is off, by the second capacitor until it has discharged substantially.

10. A switch mode converter for providing an output voltage comprising:
at least two primary switches each having a first input adapted to be coupled to an input voltage, a second input, and an output, and each switch being switchable between on and off states respectively coupling and decoupling the input voltage at the first input and the output in response to control signals supplied to the respective second input; and
controller means coupled to the second input of each of the primary switches for providing control signals thereto, the controller means providing at least one turn-on control signal during a first time period to turn a first primary switch on during the first time period, and at least one turn-on control signal during a second time period to turn a second primary switch on during the second time period, the controller means providing a third time period between each adjacent first time period and second time period during which no turn-on signals are supplied by the controller means, the controller means supplying the turn-on control signals during the first and second time periods in response to a condition of the output voltage, the controller means comprising:
a transformer coupled to each primary switch having a primary winding and a secondary winding, the secondary winding of the respective transformer being coupled to the respective second input of the respective primary switch and supplying said control signals thereto;

first current supplying means coupled to each of the primary windings of the trnsformers for supplying current to the respective transformer primary winding;

second current supplying means respectively coupled to the output of each of the primary switches and to each of the primary windings of the transformers for supplying current to the respective transformer primary winding from the input voltage when it is coupled to the output of the respective switch in the on state thereof; and switch means coupled to each of the primary windings of the transformers for selectively permitting and preventing current flow through the respective transformer primary winding;

the transformers and the first and second current supplying means cooperating to provide a turn-off control signal to switch a respective primary switch off when the switch means permits current to flow through the respective transformer primary winding and to maintain the respective primary switch off while current is permitted to flow, and to provide a turn-on control signal to switch the respective primary switch on when the switch means prevents current from flowing through the respective transformer primary winding and to maintain the respective primary switch on while current is prevented from flowing, the respective second current supplying means supplying current to the respective transformer primary winding when a respective switch is in the on state during only an initial portion of the time in which current is permitted to flow through the respective transformer primary winding effective to cause the respective transformer to switch the respective primary switch off, and the respective first current supplying means supplying current at least after the initial portion of the time in which current is permitted to flow through the respective transformer primary winding effective to cause the respective transformer to maintain the respective primary switch off and to enable the respective transformer to switch the respective primary switch back on when current is next permitted to flow through the respective transformer primary winding.

11. The converter according to claim 10 wherein the first current supplying means comprises for each transformer a first resistor adapted to be coupled to a source of energy and coupled to the respective transformer primary winding, and a first capacitor coupled to the first resistor and to the respective transformer primary winding so as to be charged through the first resistor from the source of energy and discharged through the respective transformer primary winding, and wherein the second current supplying means comprises for each transformer a second resistor coupled to the output of the respective switch and coupled to the respective transformer primary winding, and a second capacitor coupled to the second resistor and to the respective transformer primary winding so as to be charged through the second resistor from the output of the respective switch and discharged through the respective transformer primary winding, the controller means including means for blocking the flow of current between the first and second current supplying means.

12. The converter according to claim 11 wherein the current blocking means comprises a first diode coupled between each first current supplying means and each of the transformer primary windings, and a second diode coupled between each second current supplying means and each of the transformer primary windings.

13. The converter according to claim 11 wherein each primary switch is a transistor having its base coupled to a respective transformer primary winding, its collector adapted to be coupled to the input voltage to be switched, and its emitter coupled to the primary switch output.

14. The converter according to claim 13 wherein each transformer secondary winding comprises two winding portions, a main portion coupled to the base of the respective transistor and a feedback portion coupled to the emitter of the respective transistor, each transformer being configured so that its feedback portion induces current in its main portion after a respective transistor has been turned on to thereby maintain that transistor turned on.

15. The converter according to claim 11, wherein the values of the second resistor and the second capacitor are selected such that current is supplied from the output of the respective switch during said initial portion when the respective switch is on, and thereafter when the respective switch is off, by the respective second capacitor until it has discharged substantially.

16. A switch mode converter for providing an output voltage from an input voltage comprising:

at least two transistors adapted to be coupled to an input voltage to be controlled and switchable to conduct the input voltage through the transistor to an output thereof, and controller means coupled to the base of each transistor for providing control signals thereto, the controller means providing at least one turn-on control signal during a first time period to turn a first transistor on during the first time period, and at least one turn-on control signal during a second time period to turn a second transistor on during the second time period, the controller means providing a third time period between each adjacent first time period and second time period during which no turn-on signals are supplied by the controller means, the controller means supplying the turn-on control signals during the first and second time periods in response to a condition of the output voltage, the controller means comprising:

a transformer coupled to each transistor having a primary winding and a secondary winding, the secondary winding of the respective transformer being coupled to the respective base of the respective transistor and supplying said signals thereto;

first current supplying means coupled to each of the primary windings of the trnsformers for supplying current to the respective transformer primary winding;

second current supplying means respectively coupled to the output of each of the transistors and to each of the primary windings of the transformers for supplying current to the respective transformer primary winding from the input voltage when it is switched to the output of the respective transistor in the on state thereof; and switch means coupled to each of the primary windings of the transformers for selectely permitting and preventing current flow through the respective transformer primary winding;

the transformers and the first and second current supplying means cooperating to provide a turn-off control signal to switch a respective transistor off when the switch means permits current to flow through the respective transformer primary winding and to maintain the respective transistor off while current is permitted to flow, and to provide a turn-on control signal to switch a respective transistor on when the switch means prevents current from flowing through the respective transformer primary winding and to maintain the respective transistor on while current is prevented from flowing, the respective second current supplying means supplying current to the respective transformer primary winding when the respective transistor is on during only an initial portion of the time in which current is permitted to flow through the respective transformer primary winding effective to cause the respective transformer to switch the respective transistor off, and the second current supplying means supplying current at least after said initial portion of the time during which current is permitted to flow through the respective transformer primary winding effective to cause the respective transformer to switch the respective transistor off and to enable the respective transformer to switch the respective transistor back on when current is next prevented from flowing through the respective transformer primary winding.

17. The converter according to claim 16 wherein the first current supplying means comprises for each transformer a first resistor adapted to be coupled to a source of energy and coupled to a respective transformer primary winding, and a first capacitor coupled to the first resistor and to the respective transformer primary winding so as to be charged through the first resistor from the source of energy and discharged through the respective transformer primary winding, and wherein the second current supplying means comprises for each transformer a second resistor coupled to the output of the respective transistor and coupled to the respective transformer primary winding, and a second capacitor coupled to the second resistor and to the respective transformer primary winding so as to be charged through the second resistor from the source of energy and discharged through the respective transformer primary winding, the controller means including means for blocking the flow of current between the first and second current supplying means.

18. The converter according to claim 17 wherein the current blocking means comprises a first diode coupled between the first current supplying means and each of the transformer primary windings and a second diode coupled between the second current supplying means and each of the transformer primary windings.

19. The converter according to claim 17 wherein the transistors are connected in a common base configuration with the emitter of one transistor coupled to the collector of the other transistor and to a rectifying means, the respective second resistor being coupled to an output of the rectifying means and providing current to the respective second capacitor only in the on state of the respective transistor.

20. The converter according to claim 19 wherein each transformer secondary winding comprises two winding portions, a main portion coupled to the base of the respective transistor and a feedback portion coupled to the emitter of the respective transistor, each transformer being configured so that its feedback portion induces current in its main portion after a respective transistor has been turned on to thereby maintain that transistor turned on.

21. The converter according to claim 17, wherein the values of the second resistor and the second capacitor are selected such that current is supplied from the output of the respective transistor during said initial portion when the respective transistor is on, and thereafter when the respective transistor is off, by the respective second capacitor until it has discharged substantially.

* * * * *